United States Patent [19]

Noz

[11] 4,007,097
[45] Feb. 8, 1977

[54] PROCESS FOR SELECTIVELY APPLYING A METAL COATING TO THE METALLIC ARTS OF ELEMENTS WHICH PASS THROUGH AN INSULATOR

[75] Inventor: Francis X. Noz, Triesen, Switzerland
[73] Assignee: Galentan A.G., Zug, Switzerland
[22] Filed: Oct. 4, 1974
[21] Appl. No.: 512,398
[30] Foreign Application Priority Data
  Oct. 4, 1973  Switzerland ............... 14213/73
[52] U.S. Cl. ............................ 204/15; 204/224 R
[51] Int. Cl.² .................... C25D 5/02; C25D 17/16
[58] Field of Search ................... 204/15, 224 R
[56] References Cited
UNITED STATES PATENTS

| | | | |
|---|---|---|---|
| 3,304,244 | 2/1967 | Granitsas | 204/16 |
| 3,419,480 | 12/1968 | Schmidt | 204/15 |
| 3,506,887 | 4/1970 | Gutteridge | 204/15 |
| 3,658,663 | 4/1972 | Fukanuma | 204/297 W |

FOREIGN PATENTS OR APPLICATIONS

| | | | |
|---|---|---|---|
| 47-2003 | 1972 | Japan | 204/15 |
| 1,098,182 | 1/1968 | United Kingdom | 204/15 |

*Primary Examiner*—T. M. Tufariello
*Attorney, Agent, or Firm*—John J. Byrne; Edward E. Dyson

[57] ABSTRACT

A process and a device for selectively applying a metal coating, more particularly of a precious metal such as gold, to the metal parts of electrical components such as transistors, diodes and similar elements passed through an insulator means are provided for immersing the parts to be coated in a chemically active electrolyte and the parts not to be coated in a chemically inactive electrolyte and connecting the two electrolytes to the opposite polarities of the current source.

1 Claim, 8 Drawing Figures

PROCESS FOR SELECTIVELY APPLYING A METAL COATING TO THE METALLIC PARTS OF ELEMENTS WHICH PASS THROUGH AN INSULATOR

Precious metals offer advantages more particularly as a coating for metal parts of components in electronics. Application is carried out galvanically, because thin coats can be formed in this way and nevertheless exhibit sufficient purity and resistance to corrosion. In this connection, gold is to be preferred, more particularly in treating transistor housings, because this metal can easily be cold-welded and easily forms a eutectic mixture with the metal of the semiconductor element.

Because of the high price of gold, it is desirable to coat the metal parts only in selective fashion, that is to say at those places where it is necessary and the gold is functional, i.e., carried out its task.

More particularly, in the case of transistor housings, a coating of gold is desirable only on one side of the housing, that is, on the side where the crystal is arranged, and on the heads of the wires which pass in insulated fashion through the housing on this side. Glass is normally used as the insulating material. The much longer wire ends which come out on the other side do not require a gold coating. Because only a relatively small part of the transistor housing requires gold-plating, great economy in material is attained when accurate, selective gold-plating is used.

Processes for current-free gold-plating are already known. However, the quality of the coat of gold is in most cases unsatisfactory. It is thus necessary to carry out gold-plating electrolytically, an electric current being fed to the desired products, which then constitute the negative pole in a suitable electrolyte.

However, this latter treatment is difficult in the case of transistor housings. Transistor housings are built up from a cap in which separate wires are arranged among one another by means of glass. These wires, which may number from two to fourteen and in instances, even more, are all required to be connected to the negative pole of the current source, a treatment which is difficult to carry out with the geometrically inexact cartridges of transistor housings.

This invention relates to a process in which it is possible in simple fashion to provide the current-feed required for selective gold-plating quickly and reliably.

In this invention, the aforementioned components are fastened in fluid-tight fashion in apertures in an electrically insulating template in such a manner that the parts to be coated project on one side, and the parts not to be coated project on the other side thereof. The parts to be coated are at least partially immersed in an electrolyte of the coated material, which is conductively joined to an electrode to be connected to a current source, and the parts which are not to be coated are joined to a chemically inactive or substantially inactive second electrolyte which is joined to the second electrode of the current source.

The template may take the form of the base of a container preferably made of insulating material in which the apertures are disposed, or of an insulating strip with apertures which is moved upwards over a roller or a wheel.

These and other objects of the invention will become more apparent to those skilled in the art by reference to the following detailed description when viewed in light of the accompanying drawings wherein.

Although the invention is described with reference to a transistor housing, it is naturally not limited thereto, but may be used in the case of articles which may serve for other purposes.

Figure 1:
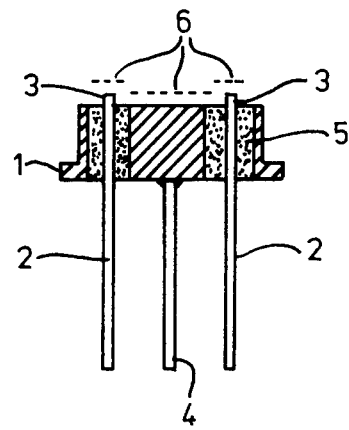
FIG. 1 is a section through a transistor housing wherein the invention may be used.

The transistor housing according to FIG. 1, consists of a metal cap 1, wires 2 passing through the cap and insulated by means of the glass 5. The upper ends of the wires will herein be referred to as posts 3. An earthing or ground wire 4 is joined to the housing. It is required to deposit gold only on posts 3 and the upper side of the housing, in those places indicated by dotted lines 6. The length of the wires 2 and 4 is 12.5 – 40 mm. They are made of nickel-iron, and are easily annealed during melting-in. Because it is a question of mass production, it is not certain whether the wires are completely straight.

Figure 2:
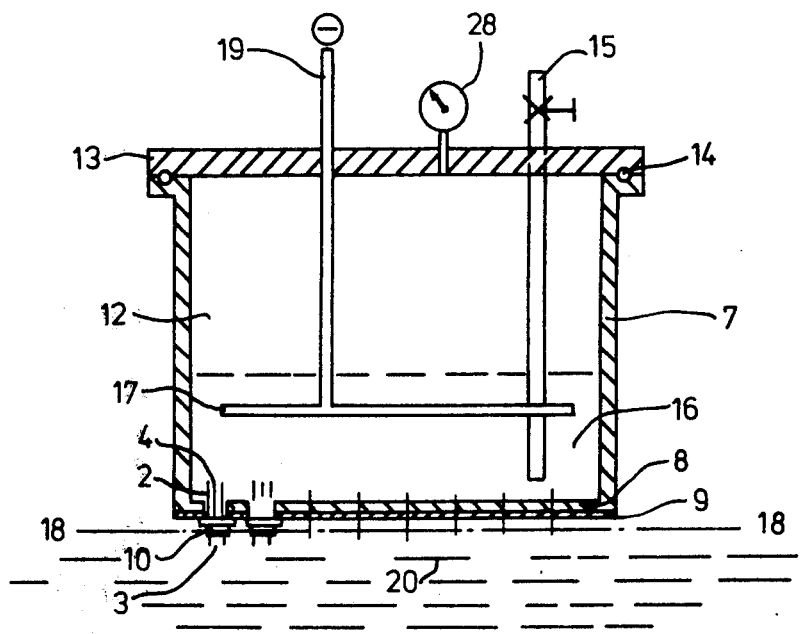
FIG. 2 is a diagrammatic cross-section of a device for using the process according to the invention.
Figure 3:
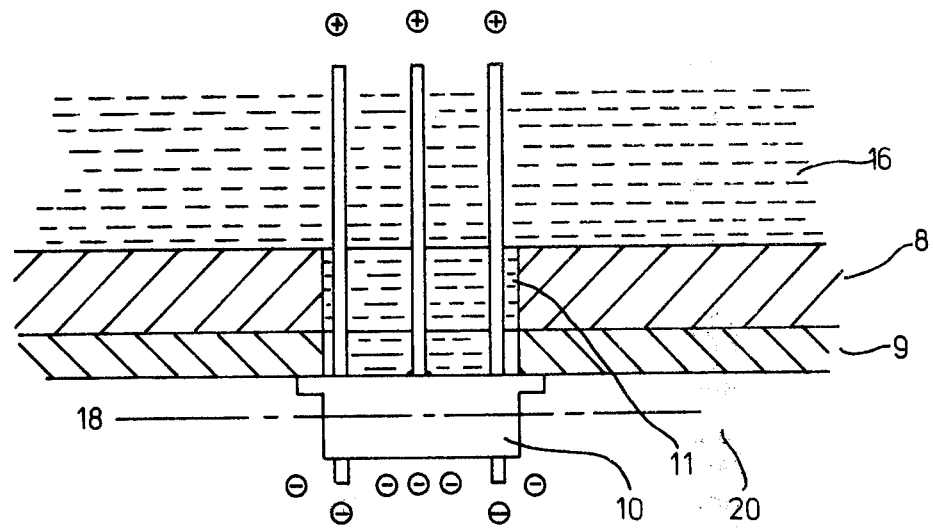
FIG. 3 is a sectional view illustrating the transistor housing during treatment.

FIG. 2 illustrates a device for coating with gold the posts and that side of the housing from which the posts project. A cylindrical casing 7 of synthetic material or an inert metal, for example titanium, is provided on the underside side with a relatively thick base 8 of material which holds its shape, and which is covered on the outside with cemented-on or vulcanized soft material 9. Base 8 is formed with a plurality of round holes 11 (FIG. 3) in which the transistor housings 10 are arranged. The housings are so positioned that the wires 2 and 4 are located in the interior of casing 7.

The casing 7 is enclosed by a sufficiently thick lid 13 which can be fastened in air-tight fashion to the casing by means of the packing 14. On this lid there is a vacuum-tight connection with a tap 15 and an air-tight connection 19 for the cathode which is linked to the stainless steel auxiliary cathode 17 which is arranged parallel to the lid, approximately as far as half-way into the cylindrical casing 7.

The cylinder 7 is filled to about 60% with an auxiliary electrolyte 16. This electrolyte 16 should have good electrical conductivity and not have any detrimental effect on the material of the transistor housing. In the event of a leak during processing, there must be no damage to the gold electrolyte 20 which is disposed below the casing 7.

In operation, the casing 7 is placed in the reversed position on a table whereupon the connection 15 is linked to an air-exhauster (vacuum) device, for example, a water radiation pump. The auxiliary electrolyte 16 is then disposed against the lid 13, while the end of the pipe 15 projects above this electrolyte 16.

The transistor housings 10 are then arranged in holes 11, for which purpose a mechanical filler system may be used. As soon as the holes 11 are filled, a vacuum is set up via the pipe 15, and the edges of the housings 10 adhere firmly to the soft sealing material 9. It is advisable to fit a vacuum-measuring instrument 28 to the lid 13, so that it is possible to check the quality of the seal and of the vacuum. After this treatment, the casing is reversed and put into the gold electrolyte 20 so that the upper side of the cap 1 and the wire posts 3 are suspended in the electrolyte 20.

The transistor housings 10 are preferably cleaned first of all, but they may also be cleaned after having been arranged in the template 8.

Figure 4:
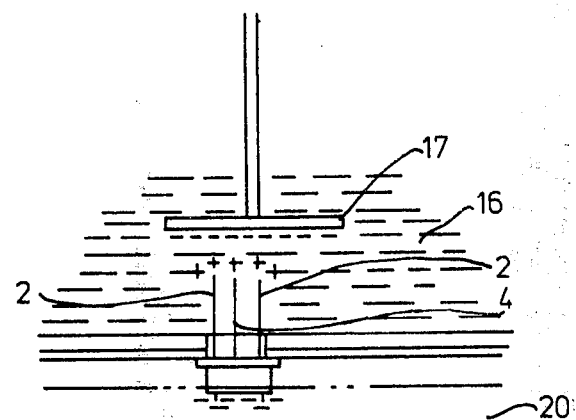
FIG. 4 is a sectional view illustrating the arrangement of the electrodes.

When gold-plating, the negative pole of the current source is connected to the contact 19. The current is transmitted to the electrolyte 16 via the auxiliary electrode 17 (FIG. 4), and thence to the wire ends 2 and 4 disposed in the electrolyte. In this way, the surface to be gold-plated is uniformly and reliably connected to the negative pole. In the gold electrolyte 20, there is finally the positive pole (anode) 21 which completes the current-carrying circuit.

After the treatment is finished, the casing 7 is again reversed, and the vacuum is released by means of the taps 15, whereupon the finished products may be extracted. The treatment is then repeated with a new filling.

A dilute solution of potassium hydroxide may, for example, be used as the electrolyte 16 when transistor housings are treated. The volume of air in the free space in the casing 7 should be so chosen that the quantities of hydrogen and oxygen given off on the auxiliary electrode 17 and on the wire ends 2 and 4 during gold-plating are considerably smaller than necessary in order to allow the vacuum to disappear.

Figure 5A:
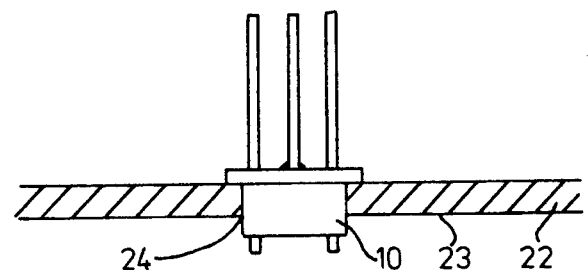
FIGS. 5A and 5B are sectional views illustrating a modified embodiment of a template.
Figure 5B:
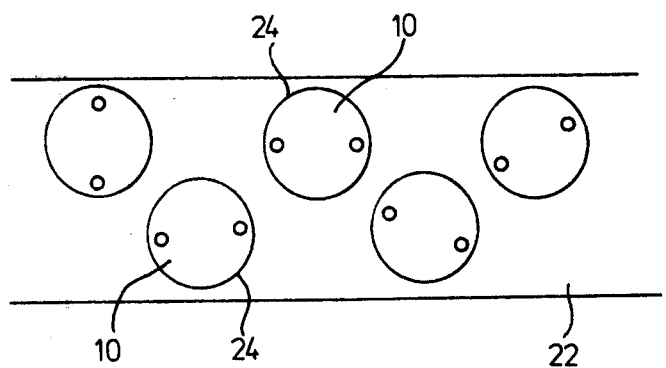

In another form of embodiment, there is an endless strip 22 (FIGS. 5A and 5B) which may be made from a core 22 of material which holds its shape, and which is provided on at least one side with a soft coating 25. One or more rows of holes 24 are formed longitudinally thereof. The transistor housings 10 are arranged in these holes, preferably in automatic fashion.

Figure 6:
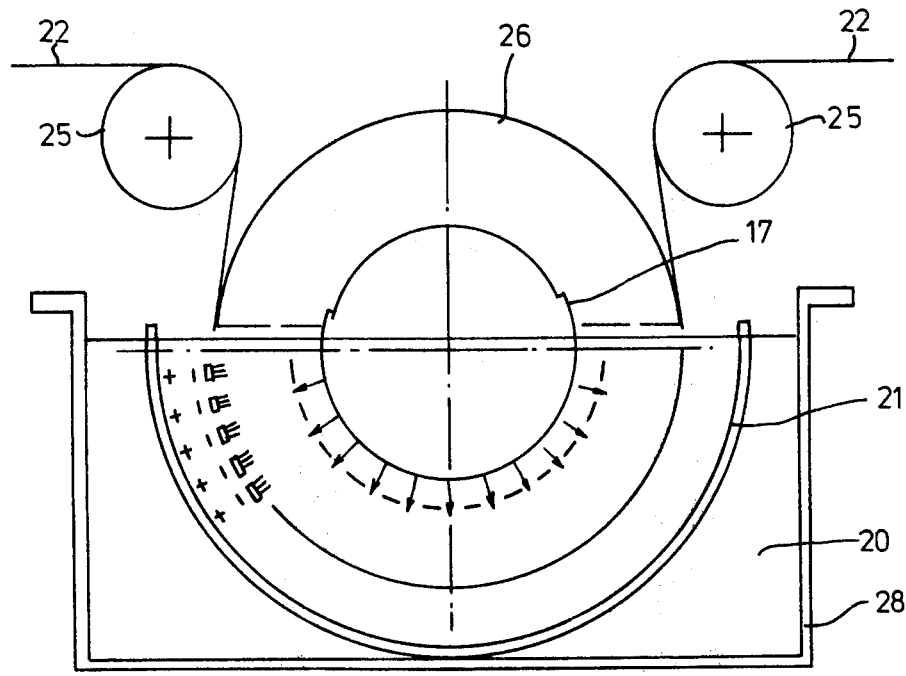
FIG. 6 is a diagrammatic view illustrating a device in which the template according to FIG. 5 is used.
Figure 7:
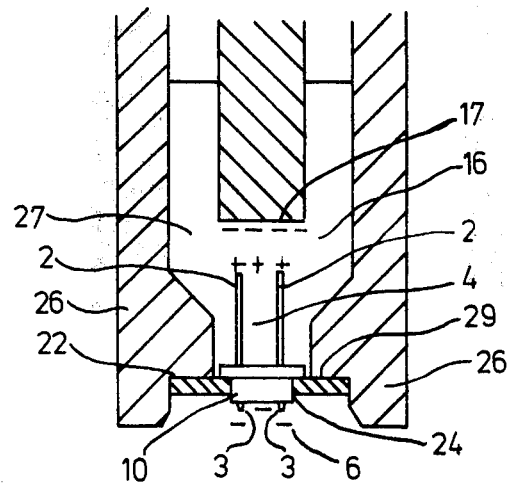
FIG. 7 is a sectional view illustrating the treatment of a single transistor housing.

As indicated in FIG. 6, the endless strip is led via auxiliary rollers 25 over a rotatable wheel 26 which is driven by the strip 22.

In the external periphery of the wheel there is a groove 29 which is completely covered by the strip 22, in such a manner that the wire ends 2 and 4 which are not to be gold-plated project into the chamber-shaped space 27 of the wheel 26. This chamber-shaped space 27 is filled with electrolyte 16, and also contains an auxiliary cathode 17. In this manner, the strip 22 and the products close the chamber 27 in fluid-tight fashion.

The wheel 26 is arranged in a container 28 in which the gold electrolyte 20 and an anode 21 are disposed. When the direct-current pole is connected to the anode 21 and the cathode 17, gold is deposited on the desired places 3 and 6. Because the groove 29 in the wheel 26 continues about the periphery, the gases developed, oxygen and hydrogen, can escape directly.

In a general manner, while there have been disclosed effective and efficient embodiments of the invention, it should be well understood that the invention is not limited to such embodiments as there might be changes made in the arrangement, disposition, and form of the parts without departing from the principles of the present invention as comprehended within the scope of the accompanying claims.

I claim:

1. A process for selectively applying a coating of a precious metal such as gold, to the metal parts of electrical components of a type having a housing in which electrical connectors have ends protruding through the sides thereof, comprising the steps of:

arranging said components in a fluid-tight fashion in apertures of an electrically insulating template in a manner such that the parts to be coated project on one side, and the parts not to be coated on the other side of the template, said template comprising the wall of a container and the parts not to be coated project inwardly of said container and the parts to be coated project exteriorly thereof, partially fillng said container with a chemically inactive first electrolyte, rendering said container substantially air tight, evacuating sufficient air from said container to produce a vacuum to hold said connectors to said template while said container is in a first position such that the first electrolyte is not in contact with said connectors, inverting said container to a second position to bring the first electrolyte inside said container into contact with said parts of said connectors not to be coated, immersing the parts to be coated at least partially in a second electrolyte of the coating material which is electrically joined to an electrode to be connected to a current source, and connecting a second electrode of said current source to said first electrolyte.

* * * * *